US009523150B2

(12) United States Patent
Itatani

(10) Patent No.: US 9,523,150 B2
(45) Date of Patent: Dec. 20, 2016

(54) SUBSTRATE PROCESSING APPARATUS, METHOD FOR MANUFACTURING SEMICONDUCTOR DEVICE AND COMPUTER-READABLE RECORDING MEDIUM

(71) Applicant: HITACHI KOKUSAI ELECTRIC INC., Tokyo (JP)

(72) Inventor: Hideharu Itatani, Nanto (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 170 days.

(21) Appl. No.: 14/482,447

(22) Filed: Sep. 10, 2014

(65) Prior Publication Data
US 2015/0267294 A1    Sep. 24, 2015

(30) Foreign Application Priority Data
Mar. 20, 2014    (JP) .................................. 2014-059223

(51) Int. Cl.
| | | |
|---|---|---|
| G06F 17/50 | (2006.01) |
| C23C 16/44 | (2006.01) |
| C23C 16/455 | (2006.01) |
| C23C 16/458 | (2006.01) |

(Continued)

(52) U.S. Cl.
CPC ......... *C23C 16/4412* (2013.01); *C23C 16/455* (2013.01); *C23C 16/458* (2013.01); *C23C 16/52* (2013.01); *H01L 21/68735* (2013.01)

(58) Field of Classification Search
CPC .... C23C 16/455; C23C 16/4412; C23C 16/52; C23C 16/458; H01J 37/32449; H01J 21/68735

See application file for complete search history.

(56) References Cited

U.S. PATENT DOCUMENTS

| 5,983,906 A | 11/1999 | Zhao et al. |
| 6,189,482 B1 * | 2/2001 | Zhao .................. C23C 16/4401 118/715 |
| 2003/0153177 A1 | 8/2003 | Tepman et al. |

(Continued)

FOREIGN PATENT DOCUMENTS

| JP | H10298767 A | 11/1998 |
| JP | 2971847 B2 | 11/1999 |

(Continued)

OTHER PUBLICATIONS

Sep. 25, 2015 Office Action issued in Korean Patent Application No. 10-2014-0067426.

(Continued)

*Primary Examiner* — Nha Nguyen
(74) *Attorney, Agent, or Firm* — Oliff PLC

(57) ABSTRACT

Provided is a substrate processing apparatus, including: a processing space configured to process a substrate: an exhaust buffer chamber which is provided so as to surround a lateral circumference of the processing space and into which a gas supplied into the processing space is flowed; and a conductance adjustment plate disposed to face a gas flow path between the processing space and the exhaust buffer chamber, wherein the conductance adjustment plate has R-shaped portion or a tapered inclined portion on an inner peripheral side edge facing the gas flow path from the processing space to the exhaust buffer chamber.

8 Claims, 6 Drawing Sheets

(51) Int. Cl.
C23C 16/52 (2006.01)
H01L 21/687 (2006.01)

(56) References Cited

U.S. PATENT DOCUMENTS

| | | | |
|---|---|---|---|
| 2005/0208217 A1* | 9/2005 | Shinriki | C23C 16/34 |
| | | | 427/248.1 |
| 2007/0264840 A1 | 11/2007 | Itatani et al. | |
| 2013/0000558 A1 | 1/2013 | Hara et al. | |

FOREIGN PATENT DOCUMENTS

| | | |
|---|---|---|
| JP | A-2000-058298 | 2/2000 |
| JP | A-2005-113268 | 4/2005 |
| JP | A-2010-202982 | 9/2010 |
| JP | 2013067844 A | 4/2013 |
| WO | 2011114940 A1 | 9/2011 |

OTHER PUBLICATIONS

Jun. 30, 2015 Office Action issued in Japanese Patent Application No. 2014-059223.

* cited by examiner

SUBSTRATE PROCESSING APPARATUS, METHOD FOR MANUFACTURING SEMICONDUCTOR DEVICE AND COMPUTER-READABLE RECORDING MEDIUM

BACKGROUND

Technical Field

The present invention relates to a substrate processing apparatus, a method for manufacturing a semiconductor device and a non-transitory computer-readable recording medium.

Description of Related Art

Generally, a substrate processing apparatus used for applying processing such as film formation processing to a wafer, etc., is used in a manufacturing step of a semiconductor device. A single wafer processing-type apparatus for processing substrates one by one, is known as the substrate processing apparatus.

As a processing performed by a single wafer processing type substrate processing apparatus, for example cyclic processing can be given, which is the processing of alternately supplying a plurality of processing gases. In this cyclic processing, film formation is performed on a substrate by setting a source gas supplying step, a purging step, a reaction gas supplying step, and a purging step as one cycle, and repeating this cycle for a specific number of times (n-cycle). Therefore, in order to efficiently perform the cyclic processing, uniform supply of a gas to the substrate in a processing space, and speedy exhaust of a remaining gas from the processing space, are requested.

In order to effectively achieve both of the uniform supply of a gas to the substrate in the processing space, and speedy exhaust of the gas from the processing space, the exhaust conductance is preferably more suitably performed.

Therefore, an object of the present invention is to provide a substrate processing apparatus, a method for manufacturing a semiconductor device and a non-transitory computer-readable recording medium, capable of suitably adjusting the exhaust conductance, thus surely equalizing a pressure in the processing space during film formation.

SUMMARY

According to an aspect of the present invention, there is provided a substrate processing apparatus, including:

a processing space configured to process a substrate:

a substrate mounting table configured to mount the substrate thereon;

an elevation mechanism configured to elevate the substrate between a transport position and a substrate processing position in the processing space by elevating the substrate mounting table;

a gas supply system configured to supply a gas into the processing space;

an exhaust buffer chamber having a space provided so as to surround a lateral circumference of the processing space, and configured to allow a gas to flow therein, the gas being supplied into the processing space;

a gas exhaust system configured to exhaust the gas flowed into the exhaust buffer chamber; and a conductance adjustment plate disposed on an outer peripheral side of the substrate, wherein the conductance adjustment plate is formed in a state that an inner peripheral side is supported by the substrate mounting table when the substrate is positioned at the substrate processing position, and in a state that an outer peripheral side is supported by a part other than the substrate mounting table when the substrate is positioned at the transport position, and has a tapered inclined portion or an R-shaped portion on an inner peripheral side edge facing a gas flow path from the processing space to the exhaust buffer chamber.

According to other aspect of the present invention, there is provided a method for manufacturing a semiconductor device, including:

elevating a substrate mounting table on which a substrate is mounted, and elevating the substrate up to a substrate processing position in a processing space, and supporting an inner peripheral side of a conductance adjustment plate having an R-shaped portion or a tapered inclined portion on an inner peripheral side edge, the conductance adjustment plate being disposed on an outer peripheral side of the substrate;

supplying a gas into the processing space of the substrate; and flowing a gas supplied into the processing space, into an exhaust buffer chamber having a space provided so as to surround a lateral circumference of the processing space, through a gas flow path on which the conductance adjustment plate is disposed, and thereafter exhausting a gas from the exhaust buffer chamber.

According to other aspect of the present invention, there is provided a non-transitory computer readable recording medium storing a program for causing a computer to execute:

a substrate mounting table elevation procedure of elevating a substrate mounting table on which a substrate is mounted, and elevating the substrate up to a substrate processing position in a processing space, and supporting an inner peripheral side of a conductance adjustment plate having an R-shaped portion or a tapered inclined portion on an inner peripheral side edge, the conductance adjustment plate being disposed on an outer peripheral side of the substrate;

a gas supplying procedure of supplying a gas into the processing space of the substrate;

a gas exhaust procedure of flowing a gas supplied into the processing space, into an exhaust buffer having a space provided so as to surround a lateral circumference of the processing space through a gas flow path on which the conductance adjustment plate is disposed, and thereafter exhausting a gas from the exhaust buffer chamber.

According to the present invention, the exhaust conductance can be suitably adjusted, thus surely achieving a uniform pressure in the processing space during film formation, and as a result, uniform film thickness on the substrate can be improved.

DETAILED DESCRIPTION

An Embodiment of the Present Invention

An embodiment of the present invention will be described hereafter, with reference to the drawings.
(1) Structure of a Substrate Processing Apparatus A substrate processing of this embodiment is configured as a single wafer processing-type substrate processing apparatus for applying processing to a substrate to be processed one by one.

A semiconductor wafer substrate (simply called a "wafer" hereafter) with a semiconductor device built therein can be given as a substrate to be processed.

Etching, ashing, and film formation processing, etc., can be given as the processing applied to the substrate. However, the processing of this embodiment is particularly the film formation processing.

Figure 1:
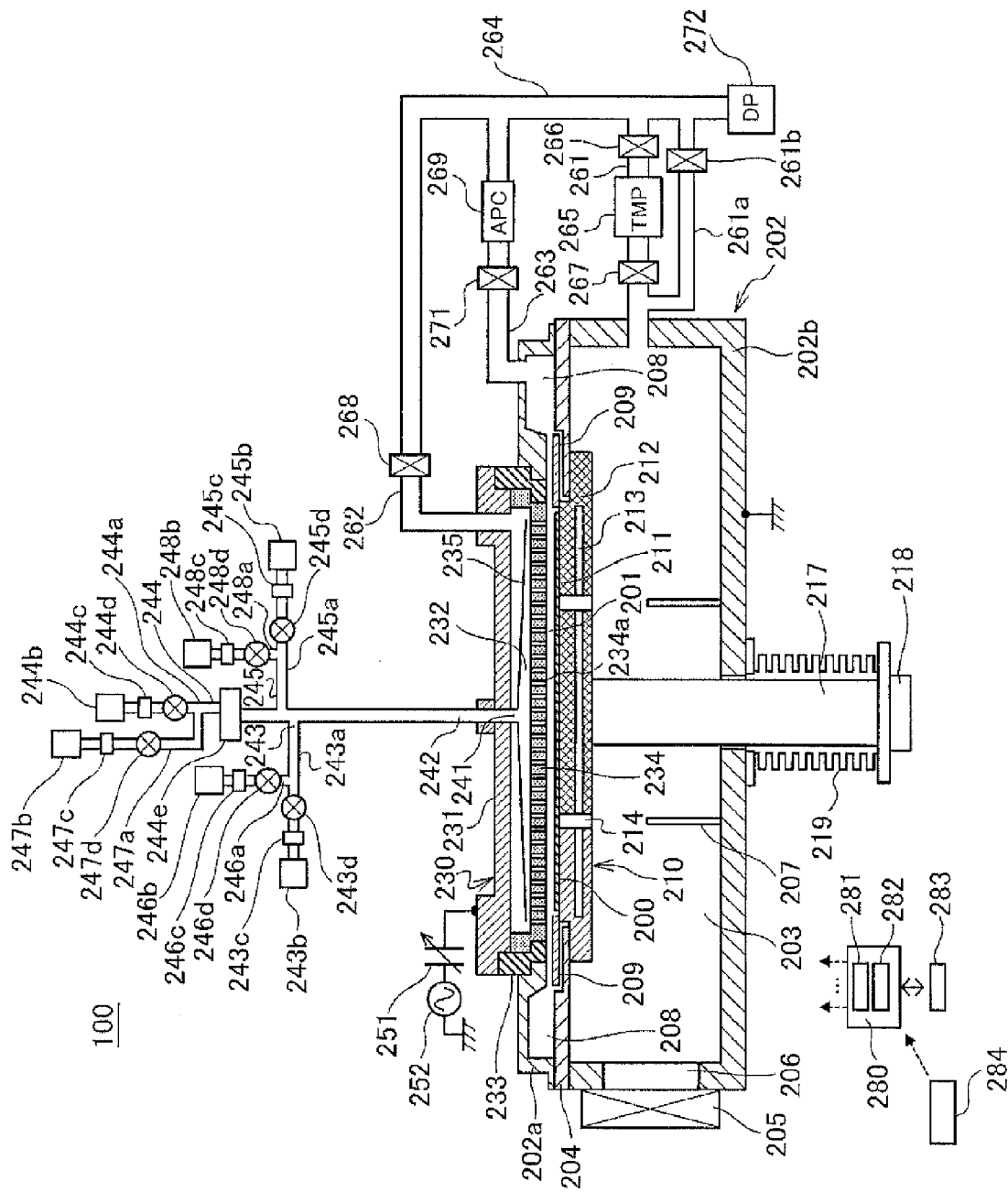
FIG. 1 is a schematic block diagram of a single wafer processing-type substrate processing apparatus according to an embodiment of the present invention.

The structure of the substrate processing apparatus of this embodiment will be described hereafter, with reference to FIG. 1. FIG. 1 is a schematic block diagram of a single wafer processing-type substrate processing apparatus according to an embodiment of the present invention.
(Processing Vessel)

As shown in FIG. 1, a substrate processing apparatus 100 includes a processing vessel 202. The processing vessel 202 is configured as a flat sealed vessel with a cross-sectional face formed into a circular shape for example. Further, the processing vessel 202 is made of a metal material such as aluminum (Al) and stainless (SUS), etc. A processing space 201 for processing a wafer 200 and a transport space 203 for allowing the wafer 200 to pass through when the wafer 200 is transported into a processing space 201, are formed in the processing vessel 202. The processing vessel 202 is composed of an upper vessel 202a and a lower vessel 202b. A partition board 204 is provided between the upper vessel 202a and the lower vessel 202b.

A substrate loading outlet 206 adjacent to a gate valve 205 is provided on a side face of the lower vessel 202b, so that the wafer 200 can move between the substrate loading outlet 206 and a transfer chamber not shown. A plurality of lift pins 207 are provided on a bottom part of the lower vessel 202b. Further, the lower vessel 202b is grounded to earth.

A substrate supporting part 210 for supporting the wafer 200 is provided in a lower part of the processing space 201. The substrate supporting part 210 mainly includes a substrate mounting surface 211 for mounting the wafer 200 thereon, a substrate mounting table 212 having the substrate mounting surface 211 on a surface, and a heater 213 as a heating source included in the substrate mounting table 212. Through holes 214 through which lift pins 207 are passed, are provided on the substrate mounting table 212 at positions corresponding to the lift pins 207 respectively.

The substrate mounting table 212 is supported by a shaft 217. The shaft 217 is passed through the bottom part of the processing vessel 202, and is further connected to an elevation mechanism 218 outside of the processing vessel 202. The wafer 200 mounted on the substrate mounting surface 211 can be elevated by elevating the shaft 217 and the substrate mounting table 212 by operating the operation mechanism 211. A circumference of a lower end portion of the shaft 217 is covered with a bellows 219, thus air-tightly maintaining an inside of the processing vessel 202.

The substrate mounting table 212 is descended so that the substrate mounting surface 211 reaches a position (wafer transport position) which is opposed to the substrate loading outlet 206 when the wafer 200 is transported, and is elevated so that the wafer 200 reaches a processing position (wafer processing position) in the processing space 201 as shown in FIG. 1, when the wafer 200 is processed.

Specifically, when the substrate 212 is descended to the wafer transport position, an upper end portion of the lift pin 207 is protruded from an upper surface of the substrate mounting surface 211, so that the wafer 200 is supported by the lift pin 207 from a lower side. Further, when the substrate mounting table 212 is elevated to the wafer processing position, the lift pin 207 is embedded from the upper surface of the substrate mounting surface 211, so that the wafer 200 is supported by the substrate mounting surface 211 from the lower side. Since the lift pin 207 and the wafer 200 are brought into direct contact with each other, and therefore the lift pin 207 is preferably made of a material such as quartz and alumina.
(Shower Head)

A shower head 230 as a gas dispersion mechanism is provided in an upper part (upstream side in the gas supplying direction) of the processing space 201. A gas introducing hole 241 is provided on a lid 231 of the shower head 230, and a gas supply system described later is connected to the gas introducing hole 241. The gas introduced from the gas introducing hole 241 is supplied to a buffer space 232 of the shower head 230.

The lid 231 of the shower head 230 is made of a conductive metal, and is used as an electrode for generating plasma in the buffer space 232 or the processing space 201. An insulation block 233 is provided between the lid 231 and the upper vessel 202a, to thereby provide insulation between the lid 231 and the upper vessel 202a.

The shower head 230 includes a dispersion board 234 for dispersing a gas supplied from the supply system through the gas introducing hole 241. A buffer space 232 is formed on the upstream side of the dispersion board 234, and the processing space 201 is formed on the downstream side of the dispersion board 234. A plurality of through holes 234a are provided on the dispersion board 234. The dispersion board 234 is disposed to face the substrate mounting surface 211.

A gas guide 235 is provided in the buffer space 232, for forming a flow of a supplied gas. The gas guide 235 has a conical shape with a diameter spreading toward the dispersion board 234, having the gas introducing hole 241 as a vertex. The gas guide 235 is formed so that its lower end is positioned at further outer peripheral side of the through hole 234a which is formed at outermost peripheral side of the dispersion board 234.
(Plasma Generator)

A matching box 251 and a RF generator 252 are connected to the lid 231 of the shower head 230. Then, plasma is generated between the shower head 230 and the processing space 201 by adjusting impedance by the RF generator 252 and the matching box 251.
(Gas Supply System)

A common gas supply pipe 242 is connected to the gas introducing hole 241 provided on the lid 231 of the shower head 230. The common gas supply pipe 242 is communicated with the buffer space 232 in the shower head 230 by connecting to the gas introducing hole 241. Further, a first gas supply pipe 243a, a second gas supply pipe 244a, a third gas supply pipe 245a, and a connection pipe 249a are connected to the common gas supply pipe 242. The second gas supply pipe 244a is connected to the common gas supply pipe 242 through a remote plasma unit (RPU) 244e.

In these gas supply pipes, a source gas is mainly supplied from a source gas supply system 243 including the first gas supply pipe 243a, and mainly a reaction gas is supplied from a reaction gas supply system 244 including the second gas supply pipe 244a. Mainly an inert gas is supplied from a purge gas supply system 245 including the third gas supply pipe 245a when the wafer is processed, and mainly a cleaning gas is supplied from this purge gas supply system 245 when the shower head 230 and the processing space 201 are cleaned.

(Source Gas Supply System)

A source gas supply source 243b, a mass flow controller (MFC) 243c being a flow rate controller (flow rate control part), and a valve 243d being an open/close valve are provided on the first gas supply pipe 243a sequentially from the upstream direction. Then, the source gas is supplied into the shower head 230 from the first gas supply pipe 243a, through the MFC 243c, the valve 243d, and the common gas supply pipe 242.

The source gas is one of the processing gases, which is the source gas obtained by vaporizing $TiCl_4$ (Titanium Tetrachloride) being a metal liquid source containing Ti (titanium) for example (namely, the source gas is $TiCl_4$ gas). The source gas may be any one of a solid state, a liquid state, and a gas state at normal temperature and normal pressure. When the source gas is in the liquid state at normal temperature and normal pressure, a vaporizer not shown may be provided between the first gas supply source 243b and the mass flow controller 243c. Here, explanation is given for a case that the source gas in the gas state.

The source gas supply system 243 is formed by mainly the first gas supply pipe 243a, the MFC 243c, and the valve 243d. The source gas supply system 243 may also include the source gas supply source 243b and a first inert gas supply system described later. Further, the source gas supply system 243 is configured to supply a source gas which is one of the processing gases, and therefore corresponds to one of the processing gas supply systems.

A downstream end of the first inert gas supply pipe 246a is connected to downstream side of the valve 243d of the first gas supply pipe 243a. A mass flow controller (MFC) 246c being a flow rate controller (flow rate control part), and a vale 246d being an open/close valve are provided on the first inert gas supply pipe 246a sequentially from the upstream direction. Then, the inert gas is supplied from the first inert gas supply pipe 246a into the shower head 230 through the MFC 246c, the valve 246d, the first gas supply pipe 243a, and the common gas supply pipe 242.

The inert gas functions as a carrier gas of the source gas, and a gas not causing a reaction with a source is preferably used. Specifically, for example nitrogen ($N_2$) gas can be used. Further, rare gas such as helium (He) gas, neon (Ne) gas, and argon (Ar) gas, etc., can be used, other than the $N_2$ gas.

A first inert gas supply system is formed mainly by the first inert gas supply pipe 246a, the MFC 246c, and the valve 246d. The first inert gas supply system may also include an inert gas supply source 246b and a first gas supply pipe 243a. Further, the first inert gas supply system may also be included in the source gas supply system 243.

(Reaction Gas Supply System)

A reaction gas supply source 244b, a mass flow controller (MFC) 244c being a flow rate controller (flow rate control part), and a valve 244d being an open/close valve are provided on the second gas supply pipe 244a sequentially from the upstream direction. RPU 244e is provided on the downstream side of the valve 244d of the second gas supply pipe 244a. Then, the reaction gas is supplied into the shower head 230 through the MFC 244c, the valve 244d, the RPU 244e, and the common gas supply pipe 242. The reaction gas is set in plasma state by the remote plasma unit 244e and the surface of the waver 200 is irradiated with plasma.

The reaction gas is one of the processing gases, and for example ammonia ($NH_3$) gas is used.

A reaction gas supply system 244 is formed mainly by the second gas supply pipe 244a, the MFC 244c, and the valve 244d. The reaction gas supply system 244 may also include the reaction gas supply source 244b, the RPU 244e, and a second inert gas supply system described later. Further, the reaction gas being one of the processing gases is supplied by the reaction gas supply system 244, and therefore the reaction gas corresponds to other one of the processing gas supply systems.

The downstream side of the second inert gas supply pipe 247a is connected to the downstream end side of the valve 244d of the second gas supply pipe 244a. An inert gas supply source 247b, a mass flow controller (MFC) 247c being a flow rate controller (flow rate control part), and a valve 247d being an open/close valve are provided on the second inert gas supply pipe 247a sequentially from the upstream direction. Then, the inert gas is supplied into the shower head 230 from the second inert gas supply pipe 247a through the MFC 247C, the valve 247d, the second gas supply pipe 244a, the RPU 244e, and the common gas supply pipe 242.

The inert gas functions as a carrier gas of the reaction gas or a diluent gas. Specifically, for example, a nitrogen ($N_2$) gas can be used. Further, rare gas such as helium (He) gas, neon (Ne) gas, and argon (Ar) gas, etc., can be used, other than the $N_2$ gas.

A second inert gas supply system is formed mainly by the second inert gas supply pipe 247a, the MFC 247c, and the valve 247d. The second inert gas supply system may also include the inert gas supply source 247d, the second gas supply pipe 243a, and the RPU 244e. Further, the second inert gas supply system may also be included in the reaction gas supply system 244.

(Purge Gas Supply System)

A purge gas supply source 245b, a mass flow controller (MFC) 245C being a flow rate controller (flow rate control part), and a valve 245d being an open/close valve are provided on the third gas supply pipe 245a sequentially form the upstream direction. Then, in the substrate processing step, the inert gas as a purge gas is supplied from the third gas supply pipe 245a into the shower head 230 through the MFC 245c, the valve 245d, and the common gas supply pipe 242. Further, in the cleaning step, the inert gas as a carrier gas of the cleaning gas or a diluent gas is supplied into the shower head 230 as needed, through the MFC 245c, the valve 245d, and the common gas supply pipe 242.

In the substrate processing step, the inert gas supplied from the purge gas supply source 245b functions as a purge gas for purging the gas accumulated in the processing vessel 202 and the shower head 230. Further, in the cleaning step, the inert gas may also function as the carrier gas of the cleaning gas or the diluent gas. Specifically, for example nitrogen ($N_2$) gas can be used as the inert gas. Further, rare gas such as helium (He) gas, neon (Ne) gas, and argon (Ar) gas, etc., can be used, other than the $N_2$ gas.

A purge gas supply system 245 is formed mainly by the third gas supply pipe 245a, the MFC 245c, and the valve 245d. The purge gas supply system 245 may also include the purge gas supply source 245b and the cleaning gas supply system described later.

(Cleaning Gas Supply System)

The downstream side of the cleaning gas supply pipe 248a is connected to the downstream end side of the valve 245d of the third gas supply pipe 245a. A cleaning gas supply source 248b, a mass flow controller (MFC) 248c, and a valve 248d being an open/close valve are provided on the cleaning gas supply pipe 248a sequentially from the upstream direction. Then, the cleaning gas is supplied from the third gas supply pipe 245a into the shower head 230 through the MFC 248c, the valve 248d, and the common gas supply pipe 242.

The cleaning gas supplied from the cleaning gas supply source 248b functions as the cleaning gas for removing byproducts, etc., adhered to the shower head 230 and the processing vessel 202 in the cleaning step. Specifically, for example nitrogen trifluoride ($NF_3$) gas can be used as the cleaning gas. Further for example, hydrogen fluoride (HF) gas, chlorine trifluoride ($ClF_3$) gas, and fluorine ($F_2$) gas may be used, and a combination of them may be used.

A cleaning gas supply system is formed mainly by the cleaning gas supply pipe 248a, the MFC 248c, and the valve 248d. The cleaning gas supply system may also include the cleaning gas supply source 248b and the third gas supply pipe 245a. Further, the cleaning gas supply system may also be included in the purge gas supply system 245.

(Gas Exhaust System)

An exhaust system for exhausting an atmosphere of the processing vessel 202 has a plurality of exhaust pipes connected to the processing vessel 202. Specifically, the exhaust system includes an exhaust pipe (first exhaust pipe) 261 connected to the transport space 203, an exhaust pipe (second exhaust pipe) 262 connected to the buffer space 232, and an exhaust pipe (third exhaust pipe) 263 connected to the processing space 201. Further, an exhaust pipe (fourth exhaust pipe) 264 is connected to the downstream side of each of the exhaust pipes 261, 262, and 263.

(First Gas Exhaust System)

The first exhaust pipe 261 is connected to a side face or a bottom face of the transport space 203. A turbo molecular pump 265 (TMP) is provided on the first exhaust pipe 261 as a vacuum pump for realizing a high vacuum state or an ultra-high vacuum state. A valve 266 is provided on the downstream side of the TMP 265 on the first exhaust pipe 261. Further, a valve 267 is provided on the upstream side of the TMP 265 on the first exhaust pipe 261. Further, a bypass pipe 261a is connected to the upstream side of the valve 267 on the first exhaust pipe 261. A valve 261b is provided on the bypass pipe 261a. The downstream side of the bypass pipe 261a is connected to the fourth exhaust pipe 264.

A first gas exhaust system is formed mainly by the first exhaust pipe 261, TMP 265, valves 266, 267, the bypass pipe 261a, and the valve 261b.

(Second Gas Exhaust System)

The second exhaust pipe 262 is connected to an upper surface of the buffer space 232 (specifically an upper position of the gas guide 235). Namely, the second exhaust pipe 262 is connected to the shower head 230, thus communicating with the buffer space 232 in the shower head 230. Further, a valve 268 is provided on the second exhaust pipe 262.

A second gas exhaust system is formed mainly by the second exhaust pipe 262 and the valve 268.

(Third Gas Exhaust System)

The third exhaust pipe 263 is connected to a side part of the processing space 201. An auto pressure controller (APC) 269 being a pressure controller for controlling a pressure in the processing space 201 to a specific pressure, is provided on the third exhaust pipe 263. The APC 269 has a valve body (not shown) capable of adjusting the opening degree, and adjusts a conductance of the third exhaust pipe 263 under an instruction from a controller described later. A valve 271 is provided on the upstream side of the APC 269 on the third exhaust pipe 263.

A third gas exhaust system is formed mainly by the third exhaust pipe 263, the APC 269, and the valve 271.

A dry pump (DP) 272 is provided on the fourth exhaust pipe 264. As shown in the figure, the second exhaust pipe 262, the third exhaust pipe 263, the first exhaust pipe 261, and the bypass pipe 261a are connected to the fourth exhaust pipe 264 from its upstream side, and DP 272 is provided on the downstream of them. DP 272 exhausts each atmosphere of the buffer space 232, the processing space 201, and the transport space 203 through each of the second exhaust pipe 262, the third exhaust pipe 263, the first exhaust pipe 261, and the bypass pipe 261a. DP 272 also functions as an auxiliary pump when TMP 265 is operated.

(An Exhaust Buffer Chamber)

An exhaust buffer chamber 208 to which the third exhaust pipe 263 is connected, functions as a buffer space when exhausting a gas in the processing space 201 toward the lateral circumference. Therefore, the exhaust buffer chamber 208 has a space provided so as to surround the lateral circumference of the processing space 201. This space is formed in such a manner that a ceiling surface and both side wall surfaces are formed by the upper vessel 202a, and a floor surface of the space is formed by a partition board 204, so that an inner peripheral side is communicated with the processing space 201. Namely, the exhaust buffer 208 has a space formed into a ring-shape (annular shape) in planer view on the outer peripheral side of the processing space 201.

The third exhaust pipe 263 of the third gas exhaust system is connected to the space of the exhaust buffer chamber 208. Thus, the gas supplied into the processing space 201 is flowed into the exhaust buffer chamber 208 through a communication path (gas flow path) between the processing space 201 and the exhaust buffer chamber 208, and the flowed gas is exhausted from the exhaust buffer 208 through the third exhaust pipe 263.

The exhaust buffer chamber 208 functions as a buffer space of exhausting a gas, and when this is taken into consideration, a size in a direction of a lateral sectional height (height of the space) is preferably larger than a size in a direction of a lateral sectional height of the gas flow path between the processing space 201 and the exhaust buffer chamber 208.

(Conductance Adjustment Plate)

A conductance adjustment plate 209 for adjusting a conductance of the gas flow path, is disposed on the gas flow path between the processing space 201 and the exhaust buffer chamber 208. The "conductance" called here means an easy flow of the gas, specifically corresponding to an inverse number of a resistance generated when the gas flows through the gas flow path.

The conductance adjustment plate 209 is formed by a plate-like member having a ring-shape (annular shape) in planer view disposed on the outer peripheral side of the wafer 200 on the substrate mounting surface 211, as a separate member from the substrate mounting table 212. Further, the conductance adjustment plate 209 is preferably formed as a forming material using quartz or ceramic (such as alumina) for example, so that a mass is larger than a mass of the wafer 200 mounted on the substrate mounting surface 211.

Regarding an arrangement position and a shape, etc., of the conductance adjustment plate 209, details will be described later.

(Controller)

The substrate processing apparatus 100 has a controller 280 for controlling an operation of each part of the substrate processing apparatus 100. The controller 280 has at least a calculation part 281 and a memory part 282. The controller 280 is connected to abovementioned each structure, retrieves a program and a recipe from the memory part 282 as needed under instruction of a host computer or a user, and controls the operation of each structure according to a content of the program or the recipe. Specifically, the controller 280 controls operations of the gate valve 205, the elevation mechanism 218, the heater 213, the RF power generator 252, the matching box 251, MFCs 243c to 248c, valves 243d to 248d, APC 269, TMP 265, DP 272, and valves 266, 267, 268, 271, and 261b, etc.

An operation panel section 284 such as a touch panel, etc., is connected to the controller 280 through a wire or wireless communication line. For example a recipe setting screen is displayed on the operation panel section 284, so that a user can perform each kind of setting (such as setting of processing conditions) on this recipe setting screen.

The controller 280 may also be configured as a dedicated computer or may be configured as a general purpose computer. For example, an external memory device storing the abovementioned program (for example, magnetic tape, a magnetic disc such as a flexible disc and a hard disc, etc., an optical disc such as MO, and a semiconductor memory such as a USB memory and a memory card, etc.) 283 is prepared, and the program is installed on the general purpose computer using the external memory device 283, to thereby constitute the controller 280 of this embodiment.

Further, means for supplying the program to the computer is not limited to a supply through the external memory device 283. For example, the program may be supplied to the computer not through the external memory device 283, using a communication means such as Internet or dedicate lines, etc., for example. The memory part 282 and the external memory device 283 are configured as a non-transitory computer-readable recording medium. They are generally simply called a recording medium hereafter. In this specification, when using the term of recording medium, this is a case including the memory part 282 alone, a case including the external memory device 283 alone, or a case including both of them.

(2) Substrate Processing Step

The step of forming a thin film on the wafer 200 using the substrate processing apparatus 100 will be described next, as one step of the method for manufacturing a semiconductor device. In the explanation hereafter, the operation of each part constituting the substrate processing apparatus 100 is controlled by the controller 280.

Here, explanation is given for an example of forming a TiN film as a metal thin film on the wafer 200 using TiCl$_4$ gas obtained by vaporizing TiCl$_4$ as a source gas (first processing gas), and using NH$_3$ gas as a reaction gas (second processing gas), and alternately supplying these gases.

Figure 2:
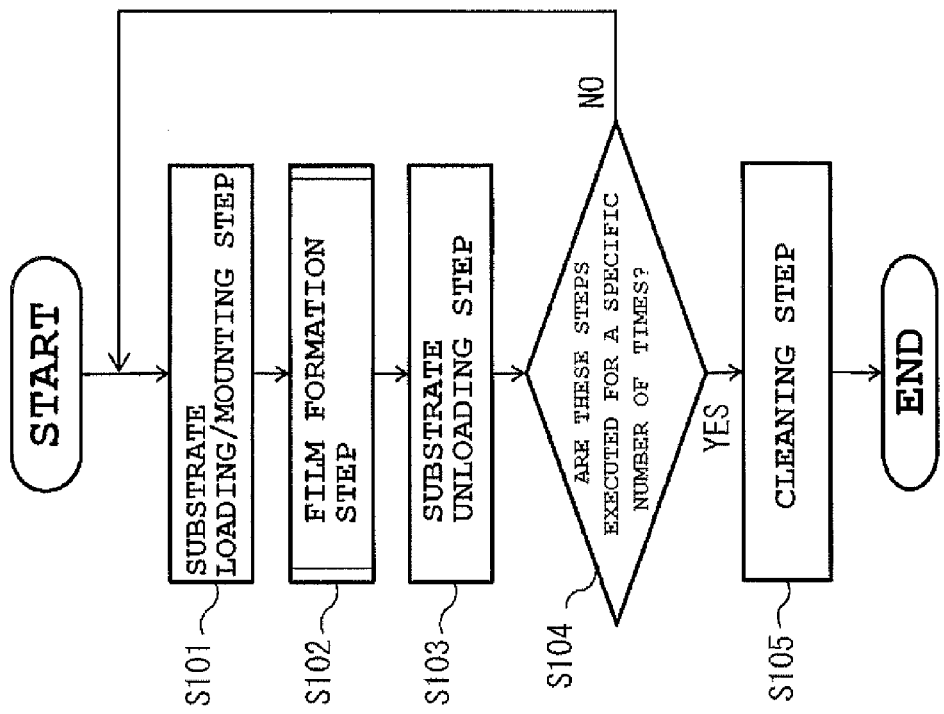
FIG. 2 is a flowchart showing a substrate processing step according to an embodiment of the present invention.
Figure 3:
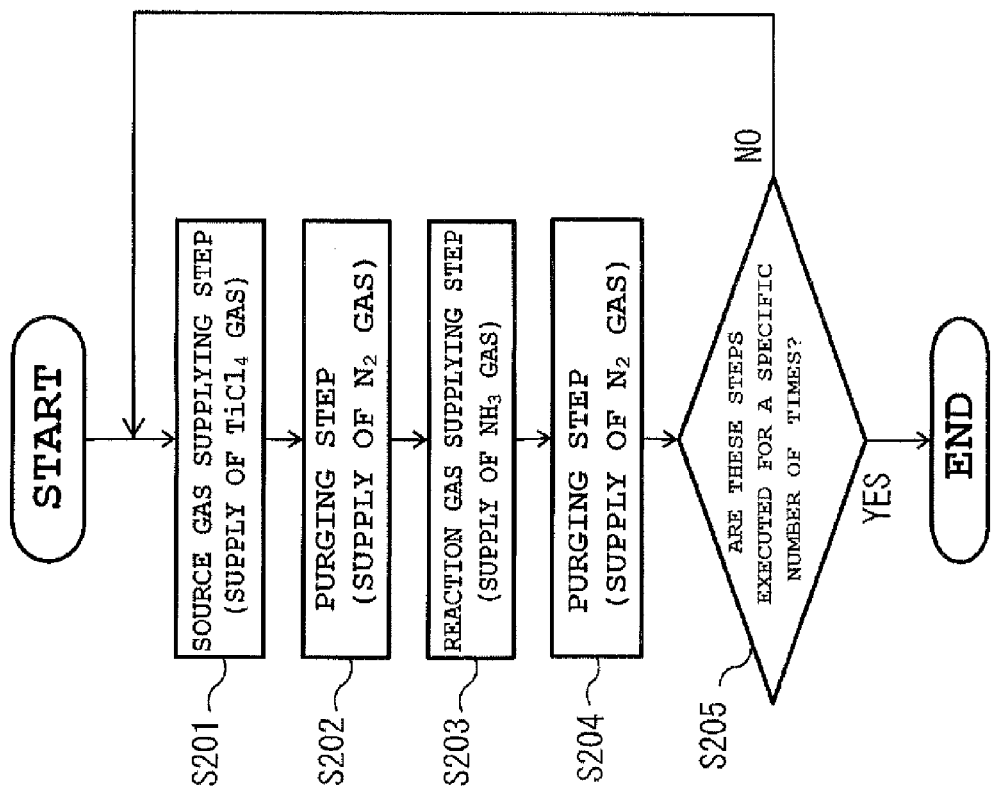
FIG. 3 is a flowchart showing a detail of the film formation step of FIG. 2.

FIG. 2 is a flowchart showing the substrate processing step according to this embodiment. FIG. 3 is a flowchart showing details of the film formation step of FIG. 2.

(Substrate Loading/Mounting Step: S101)

In the substrate processing apparatus 100, first, the lift pin 207 is passed through the through hole 214 of the substrate mounting table 212 by descending the substrate mounting table 212 to a transport position of the wafer 200. As a result, the lift pin 207 is set in a state of protruding from the surface of the substrate mounting table 212 by a specific height portion. Subsequently, the gate valve 205 is opened, to thereby communicate the transport space 203 with a transfer chamber (not shown). Then, the wafer 200 is loaded into the transport space 203 from the transfer chamber using a wafer transfer machine (not shown), to thereby transfer the wafer 200 on the lift pin 207. Thus, the wafer 200 is supported in a horizontal posture on the lift pin 207 protruded from the surface of the substrate mounting table 212.

When the wafer 200 is loaded into the processing vessel 202, the wafer transfer machine is retreated to outside of the processing vessel 202, and the gate valve 205 is closed to thereby air-tightly close the inside of the processing vessel 202. Thereafter, the wafer 200 is mounted on the substrate mounting surface 211 provided on the substrate mounting table 212 by elevating the substrate mounting table 212, and the substrate mounting table 212 is further elevated, to thereby elevate the wafer 200 up to a processing position in the abovementioned processing space 201.

When the wafer 200 is loaded into the processing vessel 202, the valve 266 and the valve 267 are set in an open state (the valve is opened), to thereby make a communication between the transport space 203 and the TMP 265, and also make a communication between the TMP 265 and the DP 272. Meanwhile, the valve of the exhaust system excluding the valve 266 and the valve 267 is set in a close state (the valve is closed). Thus, the atmosphere of the transport space 203 is exhausted by the TMP 265 (and the DP 272).

After the wafer 200 is loaded into the transport space 203 and is elevated up to the processing position in the processing space 201, the valve 266 and the valve 267 are set in a close state. Thus, the communication between the transport space 203 and the TMP 265, and the communication between the TMP 265 and the exhaust pipe 264 are blocked, to thereby end exhaust of the transport space 203 by the TMP 265. Meanwhile, the valve 271 is opened, to thereby make a communication between the processing space 201 and the APC 269. APC 269 controls an exhaust flow rate of the processing space 201 by DP 272 by adjusting the conductance of the exhaust pipe 263, and maintains the pressure in the processing space 201 in a specific pressure. The valve of other exhaust system is maintained in the close state.

In this step, N$_2$ gas may be supplied into the processing vessel 202 from the inert gas supply system as an inert gas, while exhausting the inside of the processing vessel 202. Namely, N$_2$ gas may be supplied into the processing vessel 202 by opening at least the valve 245d of the third gas supply system while exhausting the inside of the processing vessel 202 by TMP 265 or DP 272. Thus, particles can be prevented from adhering to the wafer 200.

Further, when the wafer 200 is mounted on the substrate mounting table 212, power is supplied to the heater 213 which is embedded in the substrate mounting table 212, and a temperature of the surface of the wafer 200 is controlled to a specific processing temperature. At this time, the temperature of the heater 213 is adjusted by controlling a power supply condition to the heater 213 based on temperature information detected by a temperature sensor not shown.

Thus, in the substrate loading/mounting step (S101), the pressure in the processing space 201 is controlled in a specific processing pressure, and a surface temperature of the wafer 200 is controlled in a specific processing temperature. Here, the specific processing temperature and the specific processing pressure mean the processing temperature and the processing pressure capable of forming the TiN film, and mean for example the processing temperature and the processing pressure not allowing a self-decomposition to occur in the source gas supplied in the source gas supplying step (S201). Specifically, it can be considered that the processing temperature is a room temperature or more and 500° C. or less, preferably a room temperature or more and 400° C. or less, and the processing pressure is 50 to 5000 Pa. The processing temperature and the processing pressure are also maintained in the film formation step (S102) described later.

(Film Formation Step: S102)

After the substrate loading/mounting step (S101), the film formation step (S102) is performed. The film formation step (S102) will be described hereafter in detail, with reference to FIG. 3. The film formation step (S102) is a cyclic process of repeating the step of alternately supplying different processing gases.

(Source Gas Supplying Step: S201)

In the film formation step (S102), first, a source gas supplying step (S201) is performed. In the source gas supplying step (S201), the source gas (namely $TiCl_4$ gas) is generated by vaporizing the source ($TiCl_4$) (preliminary vaporization). The preliminary vaporization of the source gas may be performed in parallel to the abovementioned substrate loading/mounting step (S101). This is because a specific time is required for stably generating the source gas.

Then, when the source gas is generated, the valve 243d is opened, and the mass flow controller 243c is adjusted so that a flow rate of the source gas reaches a specific flow rate, to thereby start supply of the source gas ($TiCl_4$ gas) into the processing space 201. A supply flow rate of the source gas is 100 to 3000 sccm for example. The source gas is dispersed by the shower head 230 and is uniformly supplied on the wafer 200 in the processing space 201.

At this time, the valve 246d of the first inert gas supply system is opened, to thereby supply the inert gas ($N_2$ gas) from the first inert gas supply pipe 246a. The supply flow rate of the inert gas is 500 to 5000 sccm for example. The inert gas may also be flowed from the third gas supply pipe 245a of the purge gas supply system.

An excessive source gas flows through the third exhaust pipe 263 of the third gas exhaust system and is exhausted to the fourth exhaust pipe 264. Specifically, the valve 271 is set in an open state, and is controlled by APC 269 so that the pressure in the processing space 201 reaches a specific pressure. All valves of the exhaust system other than the valve 271 are set in a close state.

The processing temperature and the processing pressure in the processing space 201 at this time are the processing temperature and the processing pressure so that the self-decomposition is not allowed to occur in the first source gas. Therefore, gas molecules of the source gas are adsorbed on the wafer 200.

After elapse of a specific time from start of the supply of the source gas, the valve 243d is closed, to thereby stop the supply of the source gas. The supply time of the source gas and the carrier gas is 0.1 to 20 seconds for example.

(Purging Step: S202)

After stop of the supply of the source gas, the inert gas ($N_2$ gas) is supplied from the third gas supply pipe 245a, to thereby purge the shower head 230 and the processing space 201. At this time as well, the valve 271 is set in the close state, and is controlled by APC 269 so that the pressure in the processing space 201 reaches a specific pressure. Meanwhile, all valves of the gas exhaust system other than the valve 271 are set in the close state. Thus, the source gas that cannot be adsorbed on the wafer 200 in the source gas supplying step (S201), is removed by DP 272 from the processing space 201 through the third exhaust pipe 263.

Subsequently, the inert gas ($N_2$ gas) is supplied from the third gas supply pipe 245a, to thereby purge the shower head 230. Regarding the valve of the gas exhaust system at this time, the valve 271 is set in the close state, and meanwhile the valve 268 is set in the open state. Valves of other gas exhaust systems are remained to be opened. Namely, when the shower head 230 is purged, the communication between the processing space 201 and APC 269 is blocked, and the communication between APC 269 and the fourth exhaust pipe 264 is blocked, to thereby stop pressure control by APC 269, and meanwhile the communication is made between the buffer space 232 and DP 272. Thus, the source gas remaining in the shower head 230 (buffer space 232) is exhausted by DP 272 from the shower head 230 through the second exhaust pipe 262.

When purge of the shower head 230 is ended, the valve 271 is set in the open state to thereby resume pressure control by APC 269, and the valve 268 is set in the close state to thereby block the communication between the shower head 230 and the exhaust pipe 264. Valves of other gas exhaust systems are remained to be closed. At this time as well, supply of the inert gas from the third gas supply pipe 245a is continued, and purge of the shower head 230 and the processing space 201 is continued.

Here, in the purging step (S202), purge through the exhaust pipe 263 is performed before/after purge through the second exhaust pipe 262. However, purge through the second exhaust pipe 262 only may be acceptable. Further, purge through the exhaust pipe 262 and purge through the third exhaust pipe 263 may be simultaneously performed.

The supply flow rate of the inert gas ($N_2$ gas) in the purging step (S202) is 1000 to 10000 sccm for example. Further, the supply time of the inert gas is 0.1 to 10 seconds for example.

(Reaction Gas Supplying Step: S203)

When purge of the shower head 230 and the processing space 201 is completed, subsequently, a reaction gas supplying step (S203) is performed. In the reaction gas supplying step (S203), the valve 244d is opened, to thereby start supply of the reaction gas ($NH_3$ gas) into the processing space 201 through the remote plasma unit 244e and the shower head 230. At this time, the mass flow controller 244c is adjusted so that the flow rate of the reaction gas reaches a specific flow rate. The supply flow rate of the reaction gas is 1000 to 10000 sccm for example.

The reaction gas in plasma state is dispersed by the shower head 230 and uniformly supplied on the wafer 200 in the processing space 201, and reacted with the gas molecules of the source gas adsorbed on the wafer 200, to thereby generate a TiN film of about less than one atomic layer (less than 1 Å) on the wafer 200.

At this time, the valve 247d of the second inert gas supply system is opened, to thereby supply the inert gas ($N_2$ gas)

from the second inert gas supply tube 247*a*. The supply flow rate of the inert gas is 500 to 5000 sccm for example. The inert gas may also be flowed from the third gas supply pipe 245*a* of the purge gas supply system.

The excessive gas and the reaction byproduct are flowed through the third exhaust pipe 263 of the third gas exhaust system, and exhausted to the fourth exhaust pipe 264. Specifically, the valve 271 is set in the open state, and the pressure in the processing space 201 is controlled to a specific pressure by APC 269. All valves of the exhaust system other than the valve 271 are closed.

After elapse of a specific time from start of the supply of the reaction gas, the valve 244*d* is closed, to thereby stop the supply of the reaction gas. The supply time of the reaction gas and the carrier gas is 0.1 to 20 seconds for example.

(Purging Step: S204)

After stop of supplying the reaction gas, a purging step (S204) is performed, to thereby remove the reaction gas and the reaction byproduct remaining in the shower head 230 and the processing space 201. The purging step (S204) may be performed similarly to the purging step (S202) described above, and therefore explanation is omitted here.

(Judging Step: S205)

The source gas supplying step (S201), the purging step (S203), the reaction gas supplying step (S203), and the purging step (S204) are set as one cycle, and the controller 280 judges whether or not this processing cycle is executed for a specific number of times (n-cycle) (S205). When the processing cycle is executed for a specific number of times, a titanium nitride (TiN) film having a desired film thickness is formed on the wafer 200.

(Substrate Unloading Step: S103)

After the film formation step (S102) including the abovementioned each step (S201 to S205), as shown in FIG. 2, a substrate unloading step (S103) is performed next.

In the substrate unloading step (S103), the substrate mounting table 212 is descended, and the wafer 200 is supported on the lift pin 207 protruded from the surface of the substrate mounting table 212. Thus, the wafer 200 is set at the transport position from the processing position. Thereafter, the gate valve 205 is opened, to thereby unload the wafer 200 to outside of the processing vessel 202, using the wafer transfer machine. At this time, the valve 245*d* is closed, to thereby stop the supply of the inert gas into the processing vessel 202 from the third gas supply system.

In the substrate unloading step (S103), the valve 271 is set in the close state while moving the wafer 200 to the transport position from the processing position, to thereby stop the pressure control which is performed by APC 269. Meanwhile, the valve 261*b* is set in the open state so that communication is made between the transport space 203 and DP 272, to thereby exhaust the transport space 203 by DP 272. At this time, the valves of the other exhaust systems are set in the close state.

Subsequently, when the wafer 200 is moved to the transport position, the valve 261*b* is set in the close state, to thereby block the communication between the transport space 203 and the exhaust pipe 264. Meanwhile, the valve 266 and the valve 267 are set in the open state, to thereby exhaust the atmosphere of the transport space 203 by TMP 265 (and DP 272). In this state, the gate valve 205 is opened, to thereby unload the wafer 200 from the processing vessel 202 to the transfer chamber.

(Processing Number Judging Step: S104)

After unloading the wafer 200, the controller 280 judges whether or not the number of times of executing a series of each step of the substrate unloading/mounting step (S101), the film formation step (S102), and the substrate unloading step (S103) reaches a specific number of times (S104). When it is so judged that the number of times of executing each step reaches the specific number of times, processing is moved to a cleaning step (S105). When it is so judged that the number of times of executing each step does not reach the specific number of times, the processing is moved to the substrate loading/mounting step (S101), to start the processing of a succeedingly standby wafer 200.

(Cleaning Step: S105)

In the cleaning step (S105), the valve 248*d* of the cleaning gas supply system is opened, to thereby supply the cleaning gas to the processing space 201 through the shower head 230. At this time, application of power is carried out by the RF generator 252 and impedance matching is carried out by the matching box 251, to thereby plasma-excite the cleaning gas in the shower head and the processing space 201. The plasma-excited cleaning gas removes the byproduct adhered to walls of the shower head 230 and the processing space 201.

(3) Conductance Adjustment

An conductance adjustment performed in the film formation step (S102) in the abovementioned series of substrate processing steps, will be described next.

In the film formation step (S102), TiN film having a desired film thickness is formed on the wafer 200 in the processing space 201. At this time, in order to improve a uniform film thickness of the formed TiN film, a pressure in the processing space 201 during film formation must be uniform (pressure gradient is eliminated). Therefore, in the substrate processing apparatus 100, the conductance of the gas flow path between the processing space 201 and the exhaust buffer chamber 208 is adjusted, to thereby equalize the pressure in the processing space 201.

Figure 4A:
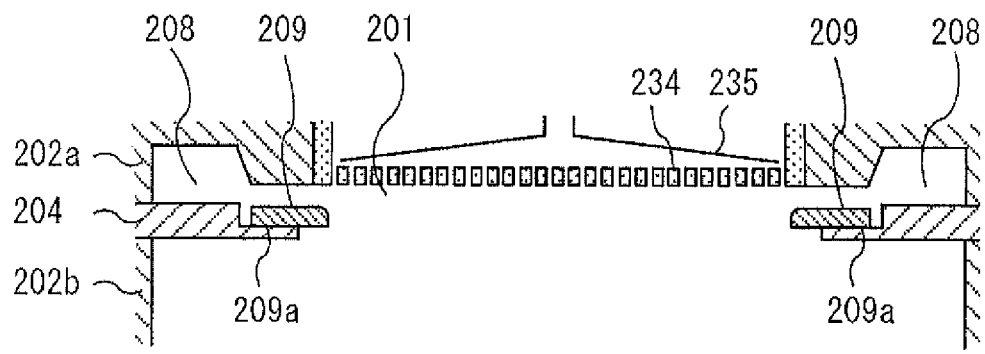
FIGS. 4A and 4B are schematic block diagrams showing a specific example of arranging a conductance adjustment plate in the substrate processing apparatus of FIG. 1.
Figure 4B:
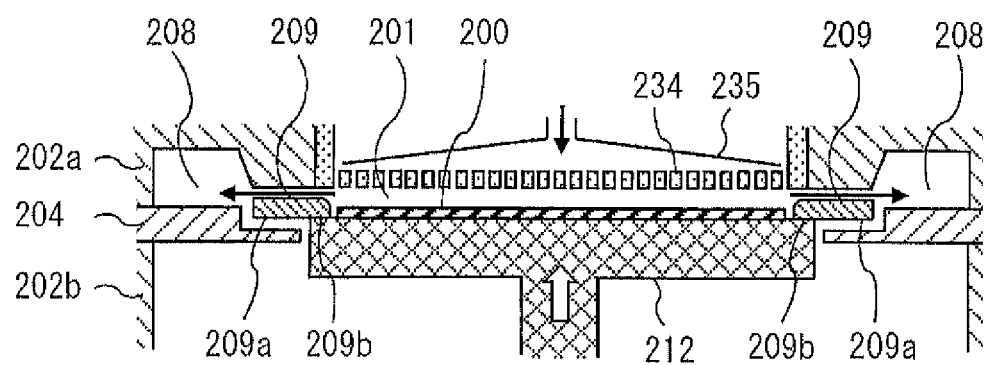
Figure 5A:
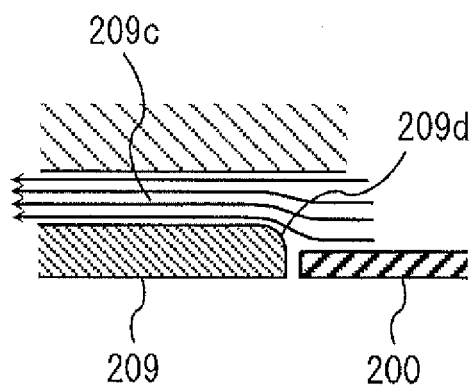
FIGS. 5A and 5B are schematic block diagrams showing a specific example of a plate shape of the conductance adjustment plate in the substrate processing apparatus of FIG. 1.
Figure 5B:
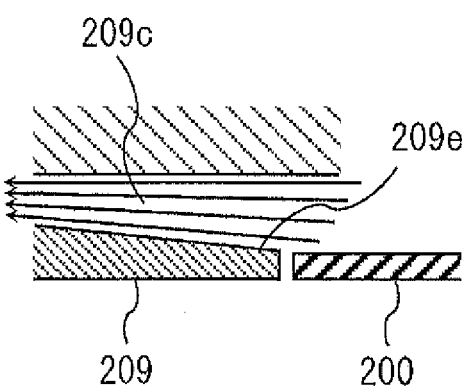
Figure 6A:
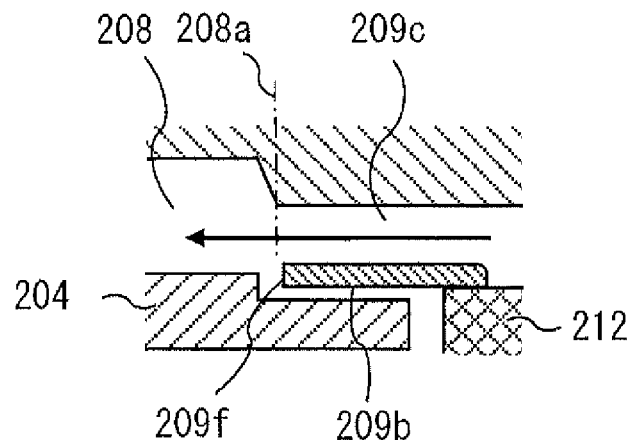
FIGS. 6A and 6B are schematic bloc diagrams showing a specific example of a positional relation between the conductance adjustment plate and an exhaust buffer chamber in the substrate processing apparatus of FIG. 1.
Figure 6B:
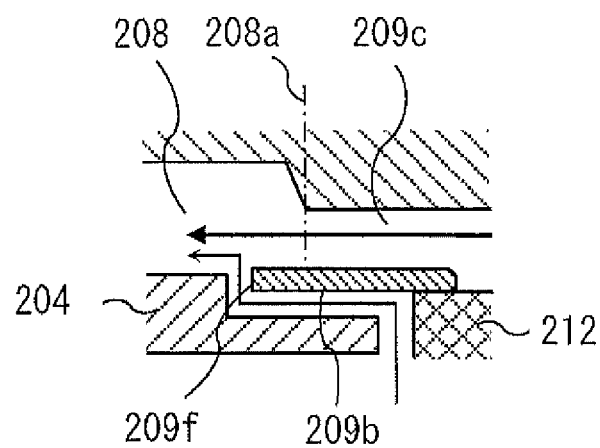

The conductance adjustment by the conductance adjustment plate 209 will be specifically descried hereafter. FIGS. 4A and 4B are schematic block diagrams showing a specific example of arranging a conductance adjustment plate according to this embodiment. FIGS. 5A and 5B are schematic block diagrams showing a specific example of a plate shape of the conductance adjustment plate according to this embodiment. FIGS. 6A and 6B are schematic block diagrams showing a specific example of a positional relation between the conductance adjustment plate and the exhaust buffer chamber.

(Plate Arrangement)

In the processing vessel 202 of the substrate processing apparatus 100, for example when the substrate loading/mounting step (S101) is performed, the substrate mounting table 212 is descended to a transport position of the wafer 200. At this time, the conductance adjustment plate 209 made of a plate member formed into a ring shape (annular shape) in planer view, is supported by the partition board 204 whose outer peripheral side portion 209*a* formed as a constitutional member of the exhaust buffer chamber 208, more specifically constituting the floor surface of the exhaust buffer chamber 208 as shown in FIG. 4A.

Thereafter, when the substrate mounting table 212 is elevated to the processing position of the wafer 200 for performing the film formation step (S102), an inner peripheral side portion 209*b* of the conductance adjustment plate 209 is lifted by the substrate mounting table 212, as shown in FIG. 4B, and an outer peripheral side portion 209*a* thereof is set in a slightly floating state from the partition board 204. Namely, an annular outer peripheral side portion 209*a* of the conductance adjustment plate 209 is separated from the partition board 204, and an inner peripheral side portion 209b thereof is supported by the constitutional member of the substrate mounting table 212, thus disposing the conductance adjustment plate 209 on the outer peripheral side of wafer 200 mounted on the substrate mounting surface 211 of the substrate mounting table 212.

Thus, the conductance adjustment plate 209 is supported by a part other than the substrate mounting table 212 when the wafer 200 is positioned at the transport position. However, when the wafer 200 is elevated to the processing position, the conductance adjustment plate 209 is lifted by the substrate mounting table 212. Thus, in the gas flow path between the processing space 201 and the exhaust buffer chamber 208, a size of the gas flow path in a lateral sectional height direction (space in the gas flow path in a height direction) is narrowed, compared with a case that the substrate mounting table 212 is descended. When the space in the gas flow path at this time is changed, flowability of the gas in the gas flow path is also changed. Namely, the conductance adjustment plate 209 functions to adjust the conductance of the gas flow path by adjusting the space in the gas flow path between the processing space 201 and the exhaust buffer chamber 208 in the height direction of the gas flow path.

In order to adjust the conductance of the gas flow path, the conductance adjustment plate 209 is preferably formed so that an upper surface height at the time of elevating the substrate mounting table 212 is the same height as the upper surface height of the wafer 200 mounted on the substrate mounting surface 211 of the substrate mounting table 212, or higher than the upper surface height of the wafer 200. This is because if the upper surface height of the conductance adjustment plate 209 is lower than the upper surface height of the wafer 200, it is difficult to adjust the conductance by the conductance adjustment plate disposed on the outer peripheral side of the wafer 200. Therefore, it can be considered as follows for example: a plate thickness of the conductance adjustment plate 209 is set to the same thickness as the plate thickness of the wafer 200, or set to be larger than the plate thickness of the wafer 200. However, the present invention is not limited thereto, and a step-shaped portion may be provided on the substrate mounting table 212.

Further, mass of the conductance adjustment plate 209 is preferably formed larger than the mass of the wafer 200 mounted on the substrate mounting surface 211, using quartz or ceramic (such as alumina) as a formation material. In this case, the mass of the entire conductance adjustment plate 209 may be larger than the mass of the entire wafer 200. The reason is as follows: although a pressure fluctuation occurs in the processing space 201 so as not to allow floating of the wafer 200 to occur, unintentional floating, etc., of the conductance adjustment plate 209 can be previously prevented even when such a pressure fluctuation occurs, by setting the mass of the conductance adjustment plate 209 to be larger than the mass of the wafer 200. More specifically, for example even in a case of performing shower head exhaust (upward exhaust) using the second gas exhaust system, the unintentional floating, etc., of the conductance adjustment plate 209 can be prevented.

(Plate Shape)

Incidentally, when the conductance of the gas flow path is adjusted between the processing space 201 and the exhaust buffer chamber 208, a partial turbulent flow is generated in the gas flowing through the gas flow path, and it can be considered that the conductance cannot be adjusted as desired. Therefore, the shape of the conductance adjustment plate 209 is formed as follows.

FIG. 5A shows an example of the plate shape. The conductance adjustment plate 209 has an R-shaped portion 209d on an upper surface side (inner peripheral side edge) facing the gas flow path 209c from the processing space 201 to the exhaust buffer chamber 208. The R-shaped portion 209d is a smoothly curved arc-shaped portion, and is disposed in the vicinity of a plate edge, at least on an upstream side of the gas flow. However, the arc-shaped portion may be disposed not only in the vicinity of the plate edge but also continuously disposed over the entire plate. Further, the size of the arc constituting the R-shaped portion 209d is not particularly limited, and may be suitably selected in consideration of the plate thickness, etc., of the conductance adjustment plate 209.

By forming such an R-shaped portion 209d on the conductance adjustment plate 209, the space in the gas flow path in the height direction is gradually changed without generating a steep step, etc., in its inside, even when the upper surface height of the conductance adjustment plate 209 is higher than the upper surface height of the wafer 200 for example. In addition, since the conductance adjustment plate 209 is formed by the plate member, a certain space in the gas flow path is maintained so that the height of the space is kept as it is along a gas flowing direction, even after the abovementioned gradual change occurs. Accordingly, in the gas flow path 209c, a partial turbulent flow is prevented from generating in the gas flowing through the gas flow path 209c, so that the flow of the gas is a laminar flow.

Further, FIG. 5B shows other example of the plate shape. The conductance adjustment plate 209 shown in the figure has a tapered inclined portion 209e on an upper surface side of the plate facing the gas flow path 209c from the processing space 201 to the exhaust buffer chamber 208. The tapered inclined portion 209e is the portion formed by a tapered surface which is inclined so that the space in the gas flow path 209c in the height direction becomes gradually narrowed along the gas flowing direction. The tapered inclined portion 209e may be disposed so that the tapered surface is continued over the entire plate, or may also be disposed so that the tapered surface is positioned in a part of the area (for example, the vicinity of the plate edge on the upstream side of the gas flow), like a case of chamfering. An inclination angle of the tapered surface is not particularly limited, and may be suitably selected in consideration of the plate thickness, etc., of the conductance adjustment plate 209.

In a case that the conductance adjustment plate 209 has such a tapered inclined portion 209e, the space in the gas flow path in the height direction is gradually changed along the gas flowing direction, similarly to the abovementioned case that the conductance adjustment plate 209 has the R-shaped portion 209d. Therefore, the partial turbulent flow is prevented from generating in the gas flowing through the gas flow path 209c, so that the flow of the gas can be the laminar flow.

As described above, the conductance adjustment plate 209 has the R-shaped portion 209d or the tapered inclined portion 209e on the upper surface side of the plate facing the gas flow path 209c. Accordingly, even when the conductance in the gas flow path 209c is adjusted using the conductance adjustment plate 209, the partial turbulent flow can be prevented from generating in the gas flowing through the gas flow path 209c, and as a result the conductance of the gas flow path 209c can be adjusted as desired.

(Relation Between the Plate and the Exhaust Buffer Chamber)

The conductance adjustment plate 209 has a positional relation with the exhaust buffer chamber 208 as follows.

FIG. 6A shows an example of the positional relation. In the positional relation shown in the figure, the conductance adjustment plate 209 is formed so that an outer peripheral side edge 209f of the conductance adjustment plate 209 is extended to a position where the outer peripheral side edge 209f of the conductance adjustment plate 209 and an inner peripheral side edge 208a of the exhaust buffer chamber 208 are aligned with each other, or is positioned on further inner peripheral side of the exhaust buffer chamber 208 (the side close to the wafer 200 on the substrate mounting surface 211). Namely, the outer peripheral side edge 209 of the conductance adjustment plate 209 does not enter into the exhaust buffer chamber 208.

According to such a positional relation, the conductance in the exhaust buffer chamber 208 is not affected by the conductance adjustment plate 209. Namely, even in a case that the conductance of the gas flow path 209c is adjusted using the conductance adjustment plate 209, the conductance in the exhaust buffer chamber can be sufficiently secured, thus not inhibiting the gas exhaust using the exhaust buffer chamber 208.

Further, FIG. 6B shows other example of the positional relation. In the positional relation shown in the figure, the conductance adjustment plate 209 is formed so that the outer peripheral edge 209f of the conductance adjustment plate 209 is extended to inside of the exhaust buffer chamber 208 beyond the inner peripheral side edge 208a of the exhaust buffer chamber 208. The outer peripheral side edge 209f of the conductance adjustment plate 209 enters into the exhaust buffer chamber 208.

According to such a positional relation, even when an unnecessary film (such as a reaction byproduct, etc.) adhered to the transport space 203 and the side wall surface, etc., of the substrate mounting table 212 is separated and flows to the side of the upper vessel 202a, the conductance adjustment plate 209 functions as a guide plate (guide) for guiding the reaction byproduct, etc., into the exhaust buffer chamber 208 (see a thin line in the figure). Namely, the reaction byproduct, etc., flowed from the side of the lower vessel 202b is directly guided into the exhaust buffer chamber 208, and is exhausted from the buffer chamber 208 as it is by the third gas exhaust system. Therefore, even in a case of performing the shower head exhaust (upward exhaust) using the second gas exhaust system for example, the reaction byproduct, etc., is prevented from passing above the wafer 200 in the processing space 201.

Regarding each positional relation described above, the conductance adjustment plate 209 may satisfy one of the positional relations, or may satisfy both positional relations together. Namely, the conductance adjustment plate 209 may have both of a first portion formed so as not allow the outer peripheral side edge 209f to enter into the exhaust buffer chamber 208 (see FIG. 6A), and a second portion formed so as to allow the outer peripheral side edge 209f to enter into the exhaust buffer chamber 208.

In this case, the conductance adjustment plate 209 is subjected to an area division in an annular peripheral direction, so that the first portion and the second portion are distributed to each area. The area division in the annular peripheral direction may be performed in consideration of a connection part of the exhaust buffer chamber 208 and the gas exhaust system. Specifically, for example, it can be considered that an area away from the connection part of the third exhaust pipe 263 of the third gas exhaust system connecting to the exhaust buffer chamber 208 is formed as the first portion for securing conductance in the exhaust buffer chamber 208, and meanwhile an area near the connection part connecting to the third exhaust pipe 263 is formed as the second portion where the outer peripheral side edge 209f is extended to inside of the exhaust buffer chamber 208. It can also be considered that the gas exhaust system that should be taken into consideration, may be the second gas exhaust system for performing the shower head exhaust (upward exhaust), and for example an area near the connection part of the second exhaust pipe 262 of the second gas exhaust system connecting to the shower head 230, is formed as the second portion.

(Control of a Plate Position)

As described above, the conductance of the gas flow path 209c is adjusted by lifting the conductance adjustment plate 209 up to the processing position of the wafer 200 by the substrate mounting table 212. An elevating position of the substrate mounting table 212 at this time, may be fixedly selected, or also may be arbitrarily varied. The elevating position of the substrate mounting table 212 may be varied by controlling an operation of the elevation mechanism 218 by the controller 280.

When the elevating position of the substrate mounting table 212 is changed, the position (height) of the upper surface of the conductance adjustment plate 209 is also changed. Therefore, the space in the gas flow path 209c in the height direction between the processing space 201 and the exhaust buffer chamber 208 is also changed accordingly. Namely, the controller 280 can arbitrarily vary an adjustment amount of the conductance in the gas flow path 209c by changing the elevating position of the substrate mounting table 212 by controlling the operation of the elevation mechanism 218.

Thus, when the controller 280 adjusts the conductance of the gas flow path 209c by varying the elevating position of the substrate mounting table 212 by the elevation mechanism 218, for example an adjustment amount of the conductance can be differentiated according to the processing to be executed. Specifically, it can be considered that the adjustment amount of the conductance of the gas flow path 209c is differentiated depending on a processing content (for example the kind of the thin film formed on the wafer 200) in the substrate processing step.

When the elevating position of the substrate mounting table 212 is varied by the controller 280 when adjusting the conductance of the gas flow path 209c, the elevating position of the substrate mounting table 212 may be previously set in a program or a recipe, etc., in the memory part 282, or may be arbitrarily set using the operation panel section 284. It can be considered that arbitrary setting using the operation panel section 284 is performed on a recipe setting screen displayed on the operation panel section 284. In this case, the elevating position (namely, a variable position of the conductance adjustment plate 209) of the substrate mounting table 212 is set using the recipe setting screen.

Setting of the variable position of the conductance adjustment plate 209 is performed by presetting and selecting several stages from a default position (lowest position) for example. Also, an arbitrary position can be selected as the variable position at a specific interval (for example interval of 0.1 mm).

By such an arbitrary setting of the conductance adjustment plate 209 using the recipe setting screen, a desired conductance adjustment state can be realized, and therefore versatility of the substrate processing apparatus 100 can be increased, and an extremely excellent convenience of the substrate processing apparatus 100 for a user can be expected.

The elevating position of the substrate processing apparatus 212 can be varied (the position of the upper surface of the conductance adjustment plate 209 can be varied) per each processing unit according to each processing, and also can be varied during the processing, for realizing a desired conductance adjustment state. Namely, the elevating position of the substrate mounting table 212 can be varied by the elevation mechanism 218 under control of the controller 280 during the processing applied to the wafer 200 in the processing space 201.

Specifically, for example, when purging or vacuuming is performed (namely, when the processing gas is not supplied) during the film formation step (S102), it can be considered that easy flow of the gas is made by descending the substrate mounting table 212 and lowering the position of the upper surface of the conductance adjustment plate 209, thereby increasing the conductance of the gas flow path 209c. Further for example, it can be considered that the conductance of the gas flow path 209c is increased by lowering the position of the upper surface of the conductance adjustment plate 209 when supplying a large amount of gas, in such a manner that the substrate mounting table 212 is descended when supplying the NH$_3$ gas in the reaction gas supplying step (S203), compared with a case of supplying the TiCl$_4$ gas in the source gas supplying step (S201). Further for example, it can also be considered that the elevating position of the substrate mounting table 212 is differentiated between a case of initially supplying a gas into the processing space 201, and a case close to an end of supplying a gas. Further for example, it can also be considered that the elevating position of the substrate mounting table 212 is differentiated between an initial time of the film formation and thereafter.

Thus, by adjusting the conductance by varying the elevating position of the substrate mounting table 212 during processing, the conductance adjustment state can be varied for each step (S201 to S204) in the film formation step (S102) and for each type of the supplied gas. This is extremely effective for appropriately performing the processing.

(4) Effect of the Embodiment

According to this embodiment, one or a plurality of following effects can be exhibited.

(a) According to this embodiment, the conductance of the gas flow path 209c between the processing space 201 and the exhaust buffer chamber 208, is adjusted by using the conductance adjustment plate 209, thus equalizing the pressure in the processing space 201. Therefore, uniformity can be improved in the film thickness of the TiN film formed in the processing space 201.

In addition, the conductance adjustment plate 209 used for adjusting the conductance of the gas flow path 209c has the R-shaped portion 209d or the tapered inclined portion 209e on a plate upper surface side facing the gas flow path 209c. Accordingly, even when the conductance of the gas flow path 209c is adjusted using the conductance adjustment plate 209, the partial turbulent flow is prevented from generating in the gas flowing through the gas flow path 209c. Namely, by having the R-shaped portion 209d or the tapered inclined portion 209e on the conductance adjustment plate 209, the partial turbulent flow is prevented from generating in the gas flowing through the gas flow path 209c so that the flow of the gas can be the laminar flow, and as a result the conductance of the gas flow path 209c can be adjusted as desired.

Namely, according to this embodiment, exhaust conductance to the outer peripheral side of the wafer 200 can be appropriately adjusted, thus further effectively equalizing the pressure in the processing space 201 during film formation.

(b) Further, according to this embodiment, the size of the gas flow path 209c in the lateral sectional height direction, is larger than the size of the exhaust buffer chamber 208 in the lateral sectional height direction. Therefore, even when the conductance of the gas flow path 209c is adjusted using the conductance adjustment plate 209, the function of the exhaust buffer chamber 208 as the exhaust buffer space is not reduced. Namely, exhaust of the gas is not influenced by adjusting the conductance of the gas flow path 209c as much as possible.

(c) Further according to this embodiment, the upper surface height of the conductance adjustment plate 209 is set at the same height as the upper surface height of the wafer 200 mounted on the substrate mounting surface 211 of the substrate mounting table 212, or higher than the upper surface height of the wafer 200. Therefore, the conductance can be appropriately adjusted without difficulty in adjusting the conductance by the conductance adjustment plate 209.

(d) Further according to this embodiment, the outer peripheral side edge 209f of the conductance adjustment plate 209 is extended to the position where the outer peripheral side edge 209f of the conductance adjustment plate 209 and the inner peripheral side edge 208a of the exhaust buffer chamber 208 are aligned with each other, or is positioned on further inner peripheral side of the exhaust buffer chamber 208 (the side close to the wafer 200 on the substrate mounting surface 211). Therefore, even in a case of adjusting the conductance of the gas flow path 209c using the conductance adjustment plate 209, the conductance in the exhaust buffer chamber 208 can be sufficiently secured, thus not inhibiting the gas exhaust using the exhaust buffer chamber 208.

(e) Further according to this embodiment, the outer peripheral side edge 209f of the conductance adjustment plate 209 is extended to the inside of the exhaust buffer chamber 208 beyond the inner peripheral side edge 208a of the exhaust buffer chamber 208. Therefore, the reaction byproduct, etc., flowed from the side of the lower vessel 202b is directly guided into the exhaust buffer chamber 208, and is exhausted from the buffer chamber 208 as it is by the third gas exhaust system. Therefore, even in the case of performing the shower head exhaust (upward exhaust) using the second gas exhaust system for example, the reaction byproduct, etc., is prevented from passing above the wafer 200 in the processing space 201.

(f) Further according to this embodiment, the conductance adjustment plate 209 has both of the first portion formed so that the outer peripheral side edge 209 of the conductance adjustment plate 209 does not enter into the exhaust buffer chamber 208, and the second portion formed so that the outer peripheral side edge 209 of the conductance adjustment plate 209 enters into the exhaust buffer chamber 208. Therefore, the reaction byproduct, etc., from the side of the lower vessel 202b can be prevented from passing above the wafer 200 in the processing space 201.

(g) Further according to this embodiment, arrangement of the first portion and the second portion on the conductance adjustment plate 209 is determined, in consideration of the connection part connecting the exhaust buffer chamber 208 and the gas exhaust system. Therefore, both of securing the conductance in the exhaust buffer chamber 208 and preventing the reaction byproduct, etc., from passing above the wafer 200 can be realized.

(h) Further according to this embodiment, the conductance adjustment plate 209 is made of quartz or ceramic (such as alumina) so that the mass is larger than the mass of the wafer 200 on the substrate mounting surface 211, thereby preventing the unintentional floating, etc., of the conductance adjustment plate 209 even in a case of performing the shower head exhaust (upward exhaust) using the second gas exhaust system for example.

(i) Further according to this embodiment, the adjustment amount of the conductance of the gas flow path 209c can be arbitrarily varied by adjusting the conductance of the gas flow path 209c by varying the elevating position of the substrate mounting table 212 by the elevation mechanism 218 under control of the controller 280.

(j) Further according to this embodiment, when the elevating position of the substrate mounting table 212 is varied by the controller 280 when adjusting the conductance of the gas flow path 209c, the elevating position can be set on the recipe setting screen displayed on the operation panel section 284. Therefore, the versatility of the substrate processing apparatus 100 can be increased, and an extremely excellent user convenience of the substrate processing apparatus 100 can be expected.

(k) Further according to this embodiment, by adjusting the conductance by varying the elevating position of the substrate mounting table 212 during processing applied to the wafer 200 in the processing space 201, the conductance adjustment state can be varied for each step (S201 to S204) in the film formation step (S102) and for each type of the supplied gas. This is extremely effective for appropriately performing the processing.

Other Embodiment of the Present Invention

As described above, the embodiment of the present invention is specifically described. However, the present invention is not limited to the abovementioned each embodiment, and can be variously modified in a range not departing the gist of the invention.

For example, in the abovementioned embodiment, the film formation processing is given as an example of the processing performed by the substrate processing apparatus 100. However, the present invention is not limited thereto. Namely, the substrate processing apparatus 100 may perform a processing of forming an oxide film and a nitride film or the processing of forming a film containing metal, other than the film formation processing. Further, a specific content of the substrate processing is not particularly limited, and the present invention can be suitably applied to not only the film formation processing but also other substrate processing such as annealing, oxidizing, nitriding, dispersing, and lithography, etc. The present invention can also be suitably applied to other substrate processing apparatus such as an annealing apparatus, an oxidizing apparatus, a nitriding apparatus, an exposure apparatus, a coater, a drier, a heater, and a processing apparatus utilizing plasma. Coexistence of these apparatuses is also acceptable. Further, a part of the structure of a certain embodiment can be replaced by the structure of other embodiment, and the structure of other embodiment can be added to the structure of the certain embodiment. Also, regarding a part of the structure of each embodiment, addition of other structure, deletion, and replacement can be acceptable.

Further, the abovementioned embodiment shows the example of adjusting the conductance of the gas flow path 209c by varying the elevating position of the substrate mounting table 212 under control of the controller 280, for realizing a desired conductance adjustment state. However, the present invention is not limited thereto. Namely, it is also acceptable that a plurality of conductance adjustment plates 209 having different plate thicknesses are prepared, so that the conductance adjustment plate 209 to be arranged, can be exchanged as needed, to thereby physically vary the adjustment amount of the conductance of the gas flow path 209c.

<Preferable Aspects of the Present Invention>

Preferred aspects of the present invention will be supplementarily described hereafter.

[Supplementary Description 1]

According to the present invention, there is provided a substrate processing apparatus, including:

a processing space configured to process a substrate:

a substrate mounting table configured to mount the substrate thereon;

an elevation mechanism configured to elevate the substrate between a transport position and a substrate processing position in the processing space by elevating the substrate mounting table;

a gas supply system configured to supply a gas into the processing space;

an exhaust buffer chamber having a space provided so as to surround a lateral circumference of the processing space, and configured to allow a gas to flow therein, the gas being supplied into the processing space;

a gas exhaust system configured to exhaust the gas flowed into the exhaust buffer chamber; and a conductance adjustment plate disposed on an outer peripheral side of the substrate, wherein the conductance adjustment plate is formed in a state that an inner peripheral side is supported by the substrate mounting table when the substrate is positioned at the substrate processing position, and in a state that an outer peripheral side is supported by a part other than the substrate mounting table when the substrate is positioned at the transport position, and has a tapered inclined portion or an R-shaped portion on an inner peripheral side edge facing a gas flow path from the processing space to the exhaust buffer chamber.

[Supplementary Description 2]

Preferably, there is provided the substrate processing apparatus according to the supplementary description 1, wherein an upper surface height of the conductance adjustment plate is set at the same height as an upper surface height of the substrate or higher than the upper surface height of the substrate, when the substrate is positioned at the substrate processing position.

[Supplementary Description 3]

Preferably, there is provided the substrate processing apparatus according to the supplementary description 1 or 2, wherein the conductance adjustment plate is formed so that an outer peripheral side edge is extended to a position where the outer peripheral side edge of the conductance adjustment plate and an inner peripheral side edge of the exhaust buffer chamber are aligned with each other, or is positioned on more inner peripheral side than the inner peripheral side edge of the exhaust buffer chamber.

[Supplementary Description 4]

Preferably, there is provided the substrate processing apparatus according to the supplementary description 1 or 2, wherein the conductance adjustment plate is formed so that an outer peripheral side edge is extended to inside of the exhaust buffer chamber.

[Supplementary Description 5]

Preferably, there is provided the substrate processing apparatus according to the supplementary description 1 or 2, wherein the conductance adjustment plate has a first portion which is formed so that an outer peripheral side edge is extended to a position where the outer peripheral side edge of the conductance adjustment plate and an inner peripheral side edge of the exhaust buffer chamber are aligned with each other, or is positioned on more inner peripheral side than the inner peripheral side edge of the exhaust buffer chamber, and a second portion which is formed so that the outer peripheral side edge is extended to inside of the exhaust buffer chamber.

[Supplementary Description 6]

Preferably, there is provided the substrate processing apparatus according to the supplementary description 5, wherein the second portion is disposed near a connection part of the gas exhaust system.

[Supplementary Description 7]

Preferably, there is provided the substrate processing apparatus according to any one of the supplementary descriptions 1 to 6, wherein the conductance adjustment plate is formed so that a mass is larger than a mass of the substrate.

[Supplementary Description 8]

Preferably, there is provided the substrate processing apparatus according to the supplementary descriptions 7, wherein the conductance adjustment plate is made of quartz or ceramic.

[Supplementary Description 9]

Preferably, there is provided the substrate processing apparatus according to any one of the supplementary descriptions 1 to 8, including a controller configured to control the elevation mechanism, wherein the controller is configured to vary an elevating position of the substrate mounting table when the conductance adjustment plate is supported by the substrate mounting table, by controlling the elevation mechanism.

[Supplementary Description 10]

Preferably, there is provided the substrate processing apparatus according to the supplementary description 9, wherein the controller includes an operation panel section capable of setting an elevating position of the substrate mounting table using a recipe setting screen under control of the controller.

[Supplementary Description 11]

Preferably, there is provided the substrate processing apparatus according to the supplementary description 9 or 10, wherein the controller controls the elevation mechanism so that an elevating position of the substrate mounting table is variable during processing applied to the substrate.

[Supplementary Description 12]

Preferably, there is provided the substrate processing apparatus according to the supplementary description 11, wherein the controller controls the elevation mechanism so that an elevating position of the substrate mounting table at the time of supplying a gas into the processing space, and an elevating position of the substrate mounting table at the time of not supplying a gas, are different from each other.

[Supplementary Description 13]

According to other aspect of the present invention, there is provided a method for manufacturing a semiconductor device, including:

elevating a substrate mounting table on which a substrate is mounted, and elevating the substrate up to a substrate processing position in a processing space, and supporting an inner peripheral side of a conductance adjustment plate by the substrate mounting table, the conductance adjustment plate having an R-shaped portion or a tapered inclined portion on an inner peripheral side edge and being disposed on an outer peripheral side of the substrate;

supplying a gas into the processing space of the substrate; and flowing a gas supplied into the processing space, into an exhaust buffer chamber having a space provided so as to surround a lateral circumference of the processing space, through a gas flow path on which the conductance adjustment plate is disposed, and thereafter exhausting a gas from the exhaust buffer chamber.

[Supplementary Description 14]

Preferably, there is provided the method for manufacturing a semiconductor device according to the supplementary description 13, wherein an elevating position of the substrate mounting table in the elevating a substrate mounting table, can be set using a recipe setting screen.

[Supplementary Description 15]

Preferably, there is provided the method for manufacturing a semiconductor device according to the supplementary description 13 or 14, wherein an elevating position of the substrate mounting table is made variable in the supplying a gas.

[Supplementary Description 16]

Preferably, there is provided the method for manufacturing a semiconductor device according to any one of the supplementary descriptions 13 to 15, wherein an elevating position of the substrate mounting table is differentiated between the gas supplying step and the gas exhausting step.

[Supplementary Description 17]

According to other aspect of the present invention, there is provided a program configured to cause a computer to execute:

a substrate mounting table elevation procedure of elevating a substrate mounting table on which a substrate is mounted, and elevating the substrate up to a substrate processing position in a processing space, and supporting an inner peripheral side of a conductance adjustment plate by the substrate mounting table, the conductance adjustment plate being disposed on an outer peripheral side of the substrate and having an R-shaped portion or a tapered inclined portion on the inner peripheral side edge;

a gas supplying procedure of supplying a gas into the processing space of the substrate; and a gas exhausting procedure of flowing a gas supplied into the processing space, into an exhaust buffer chamber having a space provided so as to surround a lateral circumference of the processing space, through a gas flow path on which the conductance adjustment plate is disposed, and thereafter exhausting a gas from the exhaust buffer chamber.

[Supplementary Description 18]

According to other aspect of the present invention, there is provided a non-transitory computer readable recording medium storing a program configured to cause a computer to execute:

a substrate mounting table elevation procedure of elevating a substrate mounting table on which a substrate is mounted, and elevating the substrate up to a substrate processing position in a processing space, and supporting an inner peripheral side of a conductance adjustment plate by the substrate mounting table, the conductance adjustment plate being disposed on an outer peripheral side of the substrate and having an R-shaped portion or a tapered inclined portion on the inner peripheral side edge;

a gas supplying procedure of supplying a gas into the processing space of the substrate; and a gas exhausting procedure of flowing a gas supplied into the processing space, into an exhaust buffer chamber having a space provided so as to surround a lateral circumference of the processing space, through a gas flow path on which the conductance adjustment plate is disposed, and thereafter exhausting a gas from the exhaust buffer chamber.

What is claimed is:

1. A substrate processing apparatus, comprising:
    a processing space configured to process a substrate:
    a substrate mounting table configured to mount the substrate thereon;
    an elevation mechanism configured to elevate the substrate mounting table between a transport position in a transport space and a substrate processing position in the processing space;
    a partition board configured to partition off the transport space and the processing space;
    a gas supply system configured to supply a gas into the processing space;
    an exhaust buffer chamber having a space provided so as to surround a lateral circumference of the processing space, and configured to allow a gas to flow therein, the gas being supplied into the processing space;
    a gas exhaust system configured to exhaust the gas flowed into the exhaust buffer chamber; and
    a conductance adjustment plate disposed on an outer peripheral side of the substrate so as to form a gas flow path on the outer peripheral side of the substrate and between the exhaust buffer chamber and the processing space,
    wherein
    the substrate mounting table has a projecting part at an outer peripheral end, the projecting part projecting to a lower surface side of the partition board,
    the conductance adjustment plate is formed so that an inner peripheral side is supported by the substrate mounting table when the substrate is positioned at the substrate processing position, and an outer peripheral side is supported by the partition board when the substrate is positioned at the transport position, and formed so that an outer peripheral side edge is extended to an inside of the exhaust buffer chamber, and
    the partition board is configured so that an inner peripheral end is extended to a position which opposites to the gas flow path.

2. The substrate processing apparatus according to claim 1, comprising:
    a controller configured to control the elevation mechanism,
    a processing gas supply system configured to supply a processing gas to an inside of the processing space, and
    a purge gas supply system configured to supply a purge gas to the inside of the processing space,
        wherein the controller is configured to control the elevation mechanism so that the position of upper surface of the conductance adjustment plate in a case of supplying the purge gas to the inside of the processing space and in a case of exhausting the inside of the processing space is lowered than the position of the upper surface of the conductance adjustment plate in a case of supplying the processing gas to the inside of the processing space.

3. The substrate processing apparatus according to claim 2,
    wherein the controller is configured to control the processing gas supply system, the purge gas supply system and the elevation mechanism so that the processing gas and the purge gas are supplied alternately, and the position of the upper surface of the conductance adjustment plate is different between at the supply time of the processing gas and at the supply time of the purge gas.

4. The substrate processing apparatus according to claim 1, wherein distance between the outer peripheral side end of the conductance adjustment plate and the inner peripheral end of the partition board is longer than distance between a lower surface of the conductance adjustment plate and a upper surface of the partition board.

5. The substrate processing apparatus according to claim 1, comprising:
    a showerhead provided in the gas supply system; and
    a showerhead exhaust system configured to exhaust an inside of the showerhead.

6. A method for manufacturing a semiconductor device, comprising:
    elevating a substrate mounting table on which a substrate is mounted at a transport position in a transport space, and elevating the substrate up to a substrate processing position in a processing space, and supporting an inner peripheral side of a conductance adjustment plate, an outer peripheral side of which is supported by a partition board which partitions off the transport space and the processing space, by the substrate mounting table in this elevating process;
    supplying a gas into the processing space of the substrate; and
    flowing a gas supplied into the processing space, into an exhaust buffer chamber having a space provided so as to surround a lateral circumference of the processing space, through a gas flow path formed on the conductance adjustment plate, and thereafter exhausting the gas from the exhaust buffer chamber, the conductance adjustment plate being formed so that an outer peripheral side edge is extended to an inside of the exhaust buffer chamber, the partition board being formed so that an inner peripheral end is extended to a position which opposites to the gas flow path, and the substrate mounting table being formed to have a projecting part projecting to a lower surface side of the partition board at an outer peripheral end.

7. The method for manufacturing a semiconductor device according to claim 6, wherein an elevating position of the substrate mounting table is differentiated between the gas supplying step and the gas exhausting step.

8. A non-transitory computer readable recording medium storing a program configured to cause a computer to execute:
    a substrate mounting table elevation procedure of elevating a substrate mounting table on which a substrate is mounted at a transport position in a transport space, and elevating the substrate up to a substrate processing position in a processing space, and supporting an inner peripheral side of a conductance adjustment plate, an outer peripheral side of which is supported by a partition board which partitions off the transport space and the processing space, by the substrate mounting table in this elevating process;
    a gas supplying procedure of supplying a gas into the processing space of the substrate; and a gas exhausting procedure of flowing a gas supplied into the processing space, into an exhaust buffer chamber having a space provided so as to surround a lateral circumference of the processing space, through a gas flow path formed on the conductance adjustment plate, and thereafter exhausting the gas from the exhaust buffer chamber, the conductance adjustment plate being formed so that an outer peripheral side edge is extended to an inside of the exhaust buffer chamber, the partition board being formed so that an inner peripheral end is extended to a position which opposites to the as flow path, and the substrate mounting table being formed to have a projecting part projecting to a lower surface side of the partition board at an outer peripheral end.

* * * * *